United States Patent [19]
Chuang

[11] Patent Number: 6,069,794
[45] Date of Patent: May 30, 2000

[54] BUSHING FOR COMBINING FAN AND HEAT SINK

[76] Inventor: Wen-Hao Chuang, No. 13, Ta Chuan 2nd Lane, Ta-Wan Tsun, Jen-Wu Hsiang, Kaohsiung Hsien, Taiwan

[21] Appl. No.: 09/245,849

[22] Filed: Feb. 8, 1999

[51] Int. Cl.[7] .................................................. H05K 7/20
[52] U.S. Cl. ...................... 361/697; 361/695; 361/709; 361/710; 174/16.3; 165/80.3; 415/177; 310/62; 310/63; 310/64
[58] Field of Search ................................... 361/695, 697, 361/704, 709, 710; 174/16.1, 16.3; 165/80.3, 122; 257/722; 415/175, 177, 178; 310/62, 63, 64

[56] References Cited

U.S. PATENT DOCUMENTS

| | | |
|---|---|---|
| 5,409,352 | 4/1995 | Lin ............................................ 361/695 |
| 5,523,918 | 6/1996 | Chiou ........................................ 361/695 |
| 5,559,674 | 9/1996 | Katsui ....................................... 361/697 |
| 5,731,953 | 3/1998 | Sakurai ..................................... 361/695 |
| 5,879,141 | 3/1999 | Yokozawa et al. ................... 417/423.7 |

*Primary Examiner*—Leo P. Picard
*Assistant Examiner*—Boris Chervinsky
*Attorney, Agent, or Firm*—Birch, Stewart, Kolasch & Birch, LLP

[57] ABSTRACT

A bushing for combining a fan and heat sink avoids a rack usually required in a conventional combination of fan and heat sink for CPU cooling, and thereby minimizes assembly height and forms a super-thin heat dispersion mechanism. A honeycomb heat sink is designed to increase heat dispersion area for a better heat dispersion efficacy, and a fan body can be fixed at the heat sink directly in virtue of the bushing construction.

1 Claim, 3 Drawing Sheets

# BUSHING FOR COMBINING FAN AND HEAT SINK

BACKGROUND OF THE INVENTION

This invention relates to a bushing for combining fan and heat sink, particularly to a bushing that is used to combine a fan and a heat sink in shorter height to form a super-thin heat dispersion mechanism.

A cooling fan is usually combined to a heat sink via a rack in way of indirect assembly for cooling a CPU. In practice, the fan body and driving device are fixed to the rack firstly, and the rack is then fixed to the heat sink to establish a simple heat dispersion mechanism (as shown in FIG. 1). The rack is commonly made of plastic material that can not only support the fan body but insulate thermal conduction, so that the heat produced by a CPU will not impair the fan body. However, when considering minimization of a computer, a conventional combination of the fan body and its rack seems too bulky in comparison with other components, and it is especially awkward when a heat sink is joined. For the sake of minimizing space occupied by a conventional heat dispersion mechanism, this invention is proposed to provide a bushing that combines a fan and a heat sink at a minimum height to form a practical super-thin heat dispersion mechanism.

SUMMARY OF THE INVENTION

The main objects and characteristics of this invention may be classified as:

1. The bushing of this invention is made of publicly disclosed high-temperature plastic fat with poor thermal conductivity that can stand high temperature of a CPU and protect a cooling fan.
2. The anti-friction material of the bushing can prolong lifetime of a cooling fan.
3. The bushing of this invention provides a rapid combination to simplify assembly of a heat dispersion mechanism.
4. The bushing used to substitute a conventional fan rack can provide a super-thin assembly and a induction factor to decrease cost.
5. Direct connection of the bushing forms an oil chamber for lubrication that can prevent a cooling fan from overheating, and reduce vibration.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a better understanding to the present invention, together with further advantages or features thereof, at least one preferred embodiment will be elucidated below with reference to the annexed drawings which are given by way of illustration only, and thus are not limitative of the present invention, and in which.

DETAILED DESCRIPTION OF THE PREFERRED EMBODIMENT

Figure 1:
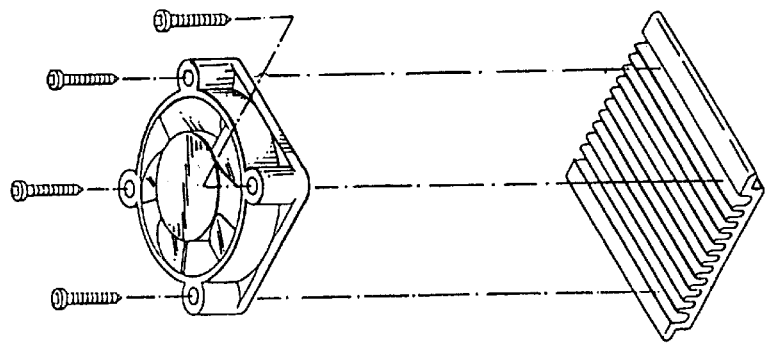
FIG. 1 is a combination schematic view of a conventional cooling fan according to the prior art.
Figure 2:
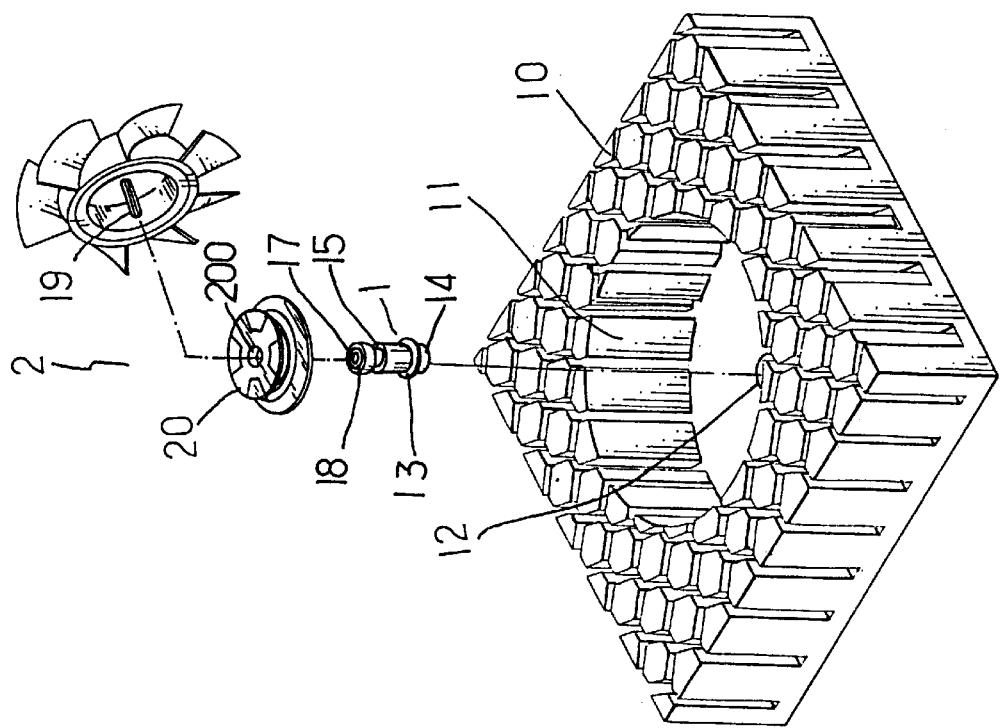
FIG. 2 is a three-dimensional exploded view of this invention.
Figure 3:
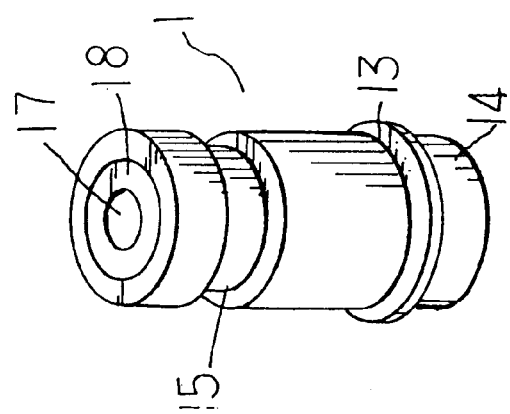
FIG. 3 is a three-dimensional view of a bushing of this invention.

As shown in FIGS. 2 and 3, a bushing 1 of this invention is fixed directly to a positioning recess 12 in a circular tank 11 of a heat sink 10, wherein a limit circular flange 13 is disposed on outer rim of the bushing 1 at a proper position. The bottom end of the circular flange 13 is extended to form a hollow cylinder 14 that is plugged in the positioning recess 12, while the upper edge of the bushing 1 is extended and sleeve-jointed to a driving device 2 of a fan. A ring groove 15 is formed at a decent position of the bushing 1 for a collaring washer 16 to attach closely, and a bearing 18 is disposed at an opening 17 in the top end of the bushing 1 for the fan pivot 19 to be fixed therein. A cover 191 is used to seal the space under bottom end of the bushing 1 to form an oil chamber 192 for lubrication.

Figure 4:
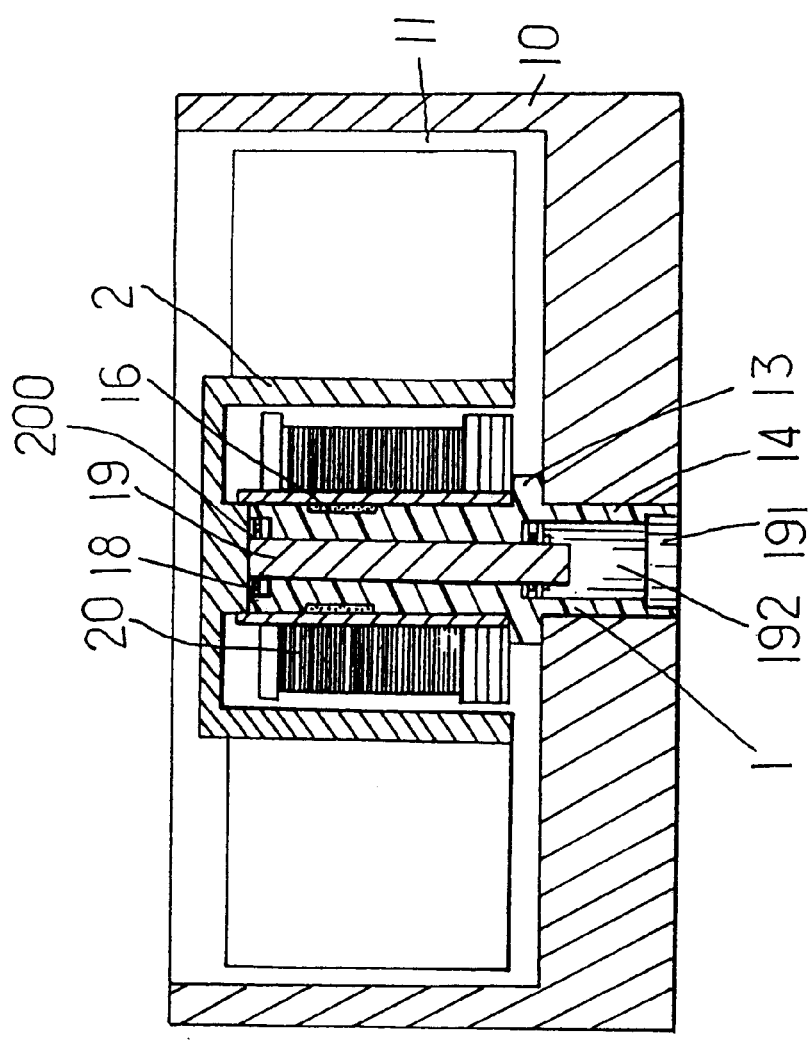
FIG. 4 is a cutaway sectional view of combination of this invention.
Figure 6:
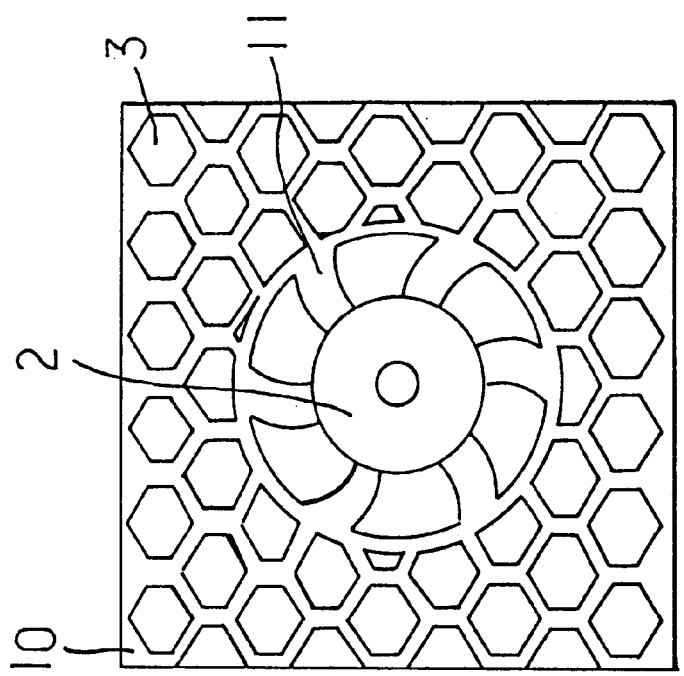
FIG. 6 is a heat dispersion schematic view of this invention.
Figure 5:
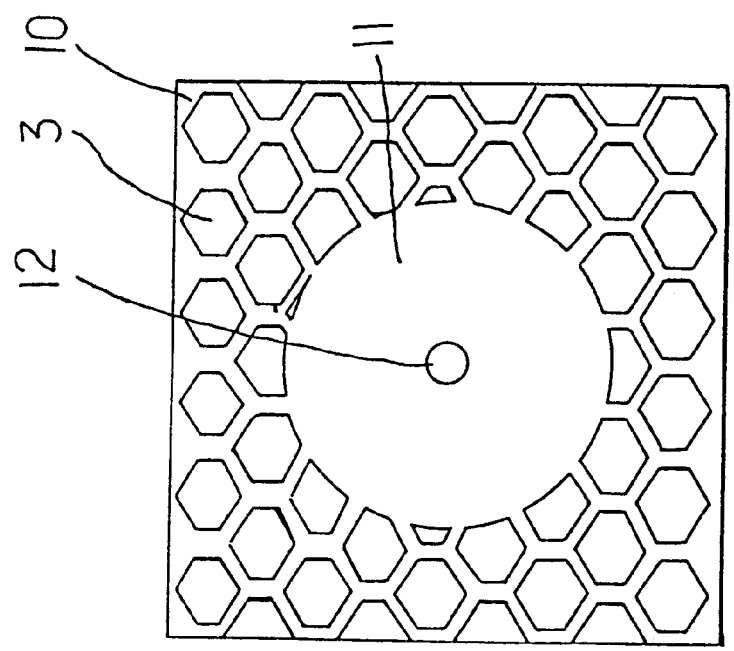
FIG. 5 is a bird's-eye view of a heat sink of this invention.

As shown in FIG. 4 through 6, the heat sink 10 of this invention is provided with a plurality of honeycomb heat dispersion posts 3 to create zigzag channels, which permit hot air to reach each post for heat dispersion. When assembling, the fan pivot 19 is put through a center hole 200 in a motor 20, then through top end of the bushing 1 and fixed at the bearing 18, and finally, the combined fan body is stationed by plugging the hollow cylinder 14 in the positioning recess 12 to accomplish a heat dispersion mechanism for cooling a CPU. The honeycomb heat sink is designed to increase heat dispersion area and to keep cooling air staying longer for better heat dispersion efficacy.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bushing for combining a fan and heat sink to form a super-thin heat dispersion mechanism, comprising:

a limit circular flange disposed on an outer rim of said bushing, the flange having a bottom edge and a top edge;

the bottom edge of said circular flange forming a hollow cylinder and being fixed at a heat sink;

the top edge of said bushing being connectable to a fan driving device;

a bearing being disposed in an opening at a top end of said bushing, the bearing accommodating a fan pivot which passes therethrough and is fixable therein;

a space being defined under the bottom end of said bushing; and a cover sealing the space under the bottom end of the bushing to form an oil chamber whereby at said hollow cylinder end, an assembled fan body is fixable directly on the heat sink.

* * * * *